United States Patent [19]
Kawasaki

[11] Patent Number: 5,239,190
[45] Date of Patent: Aug. 24, 1993

[54] LIGHT EMITTING DEVICE AND METHOD FOR MANUFACTURING THE SAME

[75] Inventor: Hideshi Kawasaki, Atsugi, Japan

[73] Assignee: Canon Kabushiki Kaisha, Tokyo, Japan

[21] Appl. No.: 975,162

[22] Filed: Nov. 12, 1992

Related U.S. Application Data

[63] Continuation of Ser. No. 472,879, Jan. 31, 1990, abandoned.

[30] Foreign Application Priority Data

Jan. 31, 1989 [JP] Japan ................................ 1-19814

[51] Int. Cl.$^5$ ............................................ H01L 33/00
[52] U.S. Cl. ........................................ 257/98; 257/94; 372/47
[58] Field of Search ............... 372/45, 47, 49; 357/17, 357/60; 257/98, 94, 96, 97

[56] References Cited

U.S. PATENT DOCUMENTS

| | | | |
|---|---|---|---|
| 4,317,086 | 2/1982 | Scifres et al. | 257/98 |
| 4,510,607 | 4/1985 | Garcia et al. | 372/49 |
| 4,901,327 | 2/1990 | Bradley | 372/47 X |
| 5,010,033 | 4/1991 | Tokunaga et al. | 437/83 |

FOREIGN PATENT DOCUMENTS 0244081 11/1987 European Pat. Off. .
0285358 10/1988 European Pat. Off. .

OTHER PUBLICATIONS

Siegman, A. *Lasers,* University Science Books, 1986, pp. 402–403.

*Primary Examiner*—Sara W. Crane
*Attorney, Agent, or Firm*—Fitzpatrick, Cella, Harper & Scinto

[57] ABSTRACT

A light emitting device comprises a substrate, a reflection mirror formed on the substrate, the reflection mirror comprising alternate lamination of amorphous or polycrystalline layers, having refractive indices different from each other; a crystal formation plane formed on the reflection mirror, the crystal formation plane comprising a nucleus non-formation plane having a low nucleus formation density and a nucleus formation plane disposed adjacent to the nucleus non-formation plane and having a higher nucleus formation density than that of said nucleus non-formation plane and a sufficiently small area to allow growth of a crystal thereon by only a single nucleus, and a light emitting area of single crystal formed on the crystal formation plane.

9 Claims, 7 Drawing Sheets

LIGHT EMITTING DEVICE AND METHOD FOR MANUFACTURING THE SAME

This application is a continuation of application Ser. No. 472,879, filed Jan. 31, 1990, now abandoned.

BACKGROUND OF THE INVENTION

1. Field of the Invention

The present invention relates to a light emitting device such as a vertical resonance type planar light emitting laser to be used in an optical integrated circuit or a display, and a method for manufacturing the same.

2. Related Background Art

Several methods have been used to manufacture a substrate reflection mirror of a vertical resonance type planar light emitting laser which has been used as a light emitting device. For example, as shown in FIG. 1, a double hetero-structure 1 is epitaxially grown on a single crystal substrate 2, and a portion of the single crystal substrate is removed to reach a resonator area, from the opposite side to the grown surface. A multi-layer film 3 comprising alternate laminations of two dielectric materials having a large difference in refractive indices is formed in the removed area, and it is used as a substrate reflection mirror. This method has been proposed by IGA et al in the pre-papers of 1988 Spring Technical Conference of the Institute of Applied Physics of Japan, 30a-Zp-4. Further, as shown in FIG. 2, a method of forming a reflection mirror 4 on a substrate 2 by laminating single crystal semiconductors having different refractive indices has also been proposed by IGA et al in the pre-papers of 1988 Spring Technical Conference of the Institute of Applied Physics of Japan, 30a-Zp-5. In this method, the double hetero-structure 1 is formed on the reflection mirror 4.

However, in the former method, a process to etch the substrate is necessary, and as a result of which the strength-is-lowered. In the latter method, the semi-conductor multi-layer film which forms a reflection mirror must be grown by the single crystal. As a result, the material to be used is restricted and it is not possible to make the difference of refractive indices of the layers large. In the multi-layer film having a small difference in the refractive indices, it is necessary to laminate several tens of pairs of semiconductor layers in order to attain a high reflection coefficient, and the film thickness must be strictly controlled. Further, because the number of layers laminated is large, electrical or optical absorption increases.

On the other hand, a method of growing a single crystal on an amorphous or polycrystalline substrate by forming planes having different nucleus formation densities on a substrate surface has been proposed in EC Laid-Open Patent Application No. 244,081. A technique to manufacture a liquid emitting diode (LED) by the use of the above method is disclosed in EC Laid-Open Patent Application No. 285,358. Such methods are hereinafter referred to an selected nucleus formation method.

SUMMARY OF THE INVENTION

It is an object of the present invention to provide a light emitting device which solves the problems encountered in the prior art device, utilizes the selective nucleus formation method, is easy to manufacture and has a high light emission efficiency, and a method for manufacturing the same.

The above object of the present invention is achieved by a light emitting device comprising;
a substrate,
a reflection mirror formed on said substrate, said reflection mirror comprising attenuate lamination of amorphous or polycrystalline layers, having refractive indexes different from each other,
a crystal formation plane formed on said reflection mirror, said crystal formation plane comprising a nucleus non-formation plane having a low nucleus formation density and a nucleus formation plane disposed adjacent to said nucleus non-formation plane and having a higher nucleus formation density than that of said nucleus non-formation plane and a sufficiently small area to allow growth of a crystal thereon by only a single nucleus; and
a light emitting areas of single crystal formed on said crystal formation plane.

It is further achieved by a method for manufacturing a light emitting device comprising the steps of:
forming a reflection mirror by alternately laminating amorphous or polycrystalline layers having different refractive indices on a substrate;
forming on a portion of said reflection mirror a nucleus formation plane having a larger nucleus formation density than that of other area and a sufficiently small area to allow growth of crystal by only a single nucleon; and
forming a light emitting area by growing a single crystal or said reflection mirror having said nuclear formation plane formed thereon.

DESCRIPTION OF THE PREFERRED EMBODIMENTS

Figure 1:
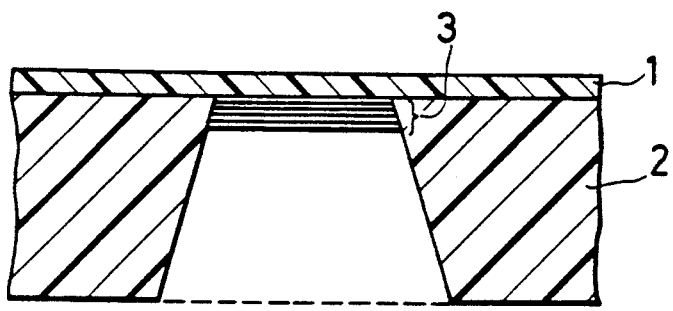
FIGS. 1 and 2 show section views of prior art light emitting devices.
Figure 2:
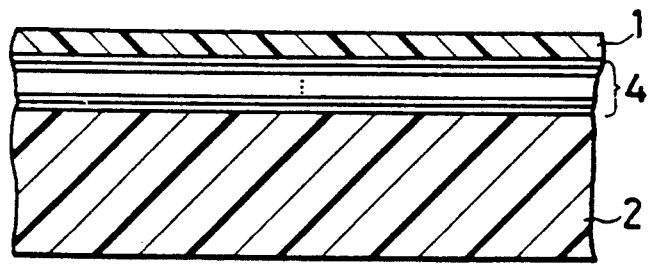
Figure 3:
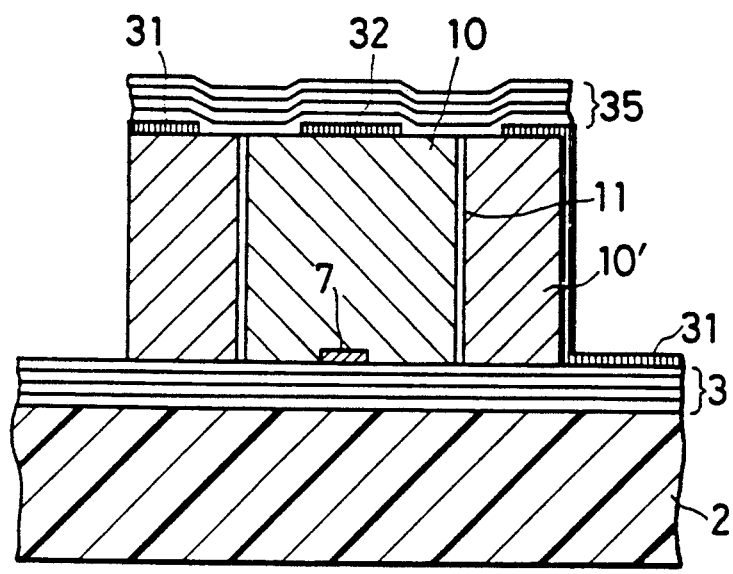
FIG. 3 shows a sectional view of one embodiment of the light emitting device of the present invention.
Figure 4:
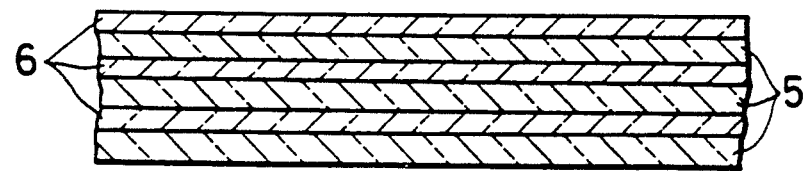
FIG. 4 shows a sectional view of a reflection mirror shown in FIG. 3, FIGS. 5A–5C show sectional views for illustrating a basic process of a selected shown formation method.

FIG. 3 shows a sectional view of one embodiment of the light emitting device of the present invention. In FIG. 3, a reflection mirror 3 made of a dielectric material multi-layer film is formed on a substrate 2 made of quartz glass or alumina. As shown in FIG. 4, the reflection mirror 3 is formed by alternately laminating a plurality of sets of low refractive index dielectric material layers 6 and a high refractive index dielectric material layer 5 having a higher refractive index than that of the layer 6. The dielectric material layers 5 and 6 are either amorphous or polycrystalline materials, of those dielectric material layers 5 and 6 are those having low light absorption property such as $SiO_2$, $TiO_2$ and $Al_2O_3$. The thicknesses of those layers are selected to one quarter of an oscillation wavelength of a laser beam emitted by the light emitting device. The last (top) layer of the multi-layer film is the low refractive index dielectric material layer 6.

The surface of the reflection mirror 3, that is, the surface of the low refractive index dielectric material layer 6 is a nucleus non-formation plane having a low nucleus formation density. As shown in FIG. 3, a substrate 7 having an exposed nucleus formation plane which has a high nucleus formation density and a sufficiently small area to allow the growth of crystal thereon by only a single nucleus, is formed on a portion of the surface of the layer 6. A light emitting area made of a single crystal grown from the nucleus formation plane is formed around the substrate 7. The light emitting area has a double hetero-structure comprising an n-type clad layer 10, an activation layer 11 and a p-type clad layer 10'. Electrodes 32 and 31 are connected to the layers 10 and 10', respectively. A reflection mirror 35 comprising a dielectric material multi-layer film which is similar in structure to the reflection mirror 3 is formed on the top of the light emitting area. When a current is supplied across the electrodes 31 and 32 from a current source (not shown), the activation layer 11 emits a light and a laser oscillation takes place in a resonator constructed by the reflection mirrors 3 and 35. The laser beam generated by the laser oscillation is emitted upward from the reflection mirror 35 and downward through the substrate 2.

Figure 5A:
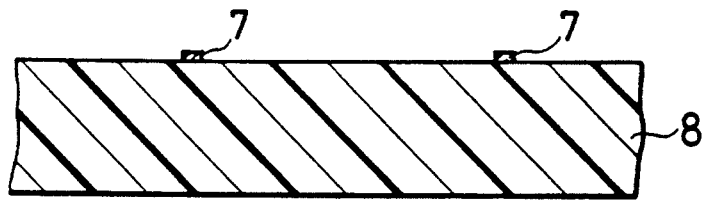

The selective nucleus formation method used to manufacture the light emitting device shown in FIG. 3 is carried out is the following basic process. As shown in FIG. 5A, the substrate 7 having the exposed nucleus formation plane which has a higher nucleus formation density than that of the nucleus non-formation plane is formed on the nucleus non-formation plane of the deposition area 8 which has a low nucleus formation density. The area of the nucleus formation plane is sufficiently small to allow the growth of crystal thereon by only a single nucleus. In the above embodiment, the low refractive index dielectric material layer 6 corresponds to the deposition area 8. The substrate 7 is formed by loading a small piece of a material having a high nucleus formation density on the top of the dielectric material layer 6. Alternatively, the high refractive index dielectric material 5 which is immediately below the surface layer of the reflection mirror, that is, the low refractive index dielectric material 6 may be formed by a material having a high nucleus formation density, and a portion of the surface layer may be locally removed to expose the surface of the high refractive index dielectric material 5 as a nucleus formation plane for use as the substrate.

Figure 5B:
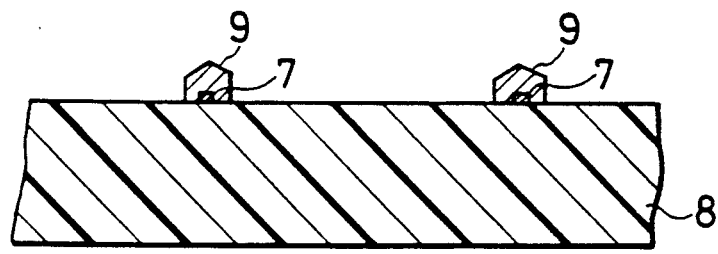

On the deposition area 8, a Group III-V compound semiconductor 9 such as GaAs, InP, GaInA(P and GaInP is grown by metal organic chemical vapor deposition (MOCVD), liquid phase epitaxy (LPE) or metal organic molecular beam epitaxy (MOMBE). The semiconductor 9 is grown on the substrate 7 due to the difference between the nucleus formation densities, as shown in FIG. 5B. Since the area of the nucleus formation plane of the substrate 7 is very small, the growth of the semiconductor 9 starts from a single nucleus and the semiconductor 9 becomes a single crystal.

Figure 5C:
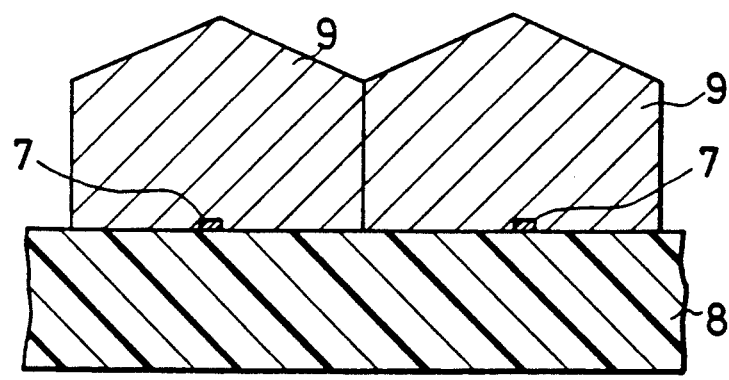

Then, as shown in FIG. 5C, the semiconductor 9 is further grown, and the light emitting area is formed by doping and machining the semiconductor 9.

A specific manufacturing process of the light emitting device of the present invention is explained with reference to FIGS. 6A-6H.

Figure 6A:
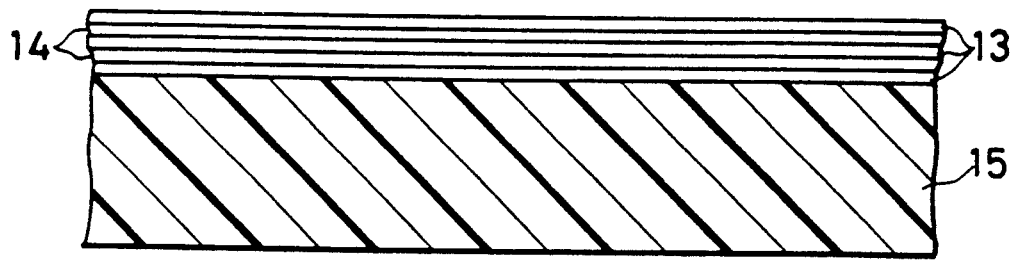
FIGS. 6A–6H show sectional views for illustrating one embodiment of the method for manufacturing the light emitting device in accordance with the present invention.

(1) As shown in FIG. 6A, $SiO_2$ films 13 and $TiO_2$ films 14 were alternately formed on a transparent quartz substrate 15 by electron beam evaporation. The thicknesses of the $SiO_2$ film 13 and the $TiO_2$ film 14 were 1500Å and 900Å, respectively.

Figure 6B:
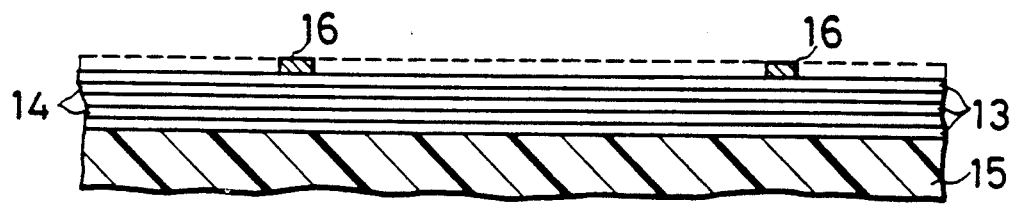

(2) As shown in FIG. 6B, an $AlO_3$ film having a predetermined thickness was formed on the surface layer of the $SiO_2$ films 13 by the electron beam evaporation. The area shown by broken lines other than a substrate 16 having a nucleus formation plane was etched away.

Figure 6C:
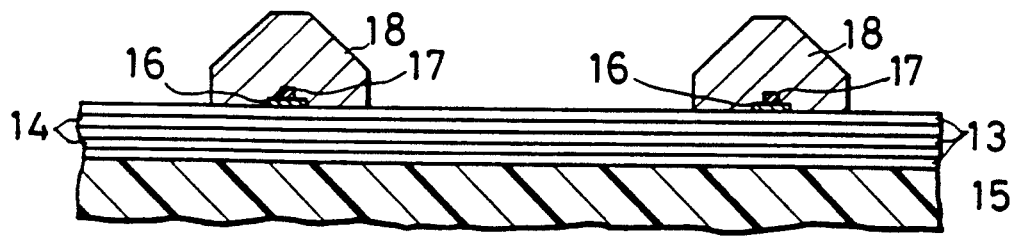

(3) As shown in FIG. 6C, a GaAs nucleus 17 was formed by the selective nucleus formation method by the MOCVD method by using TMG (trimethyl gallium) and TBAs (tertiary butyl arisine) as source materials. The growth temperature was 600° C., V/III=10, the pressure was 10 Torr.

TBAs was replaced by $AsH_3$, and an n-AlGaAs clad layer 18 was grown by TMG, TMAl (trimethyl aluminum) and dopant gas $SiH_4$. The pressure was 760 Torr and V/III=60.

Figure 6D:
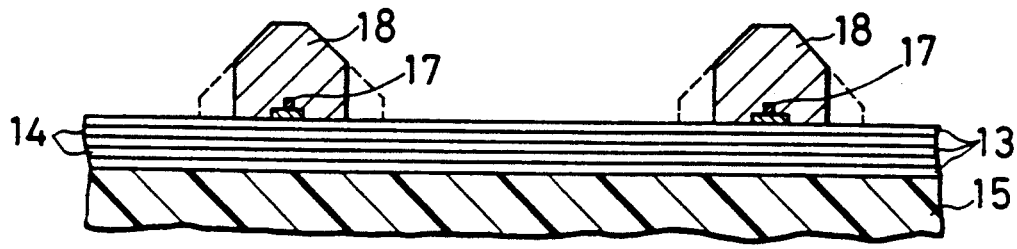

(4) As shown in FIG. 6D, the end plane of the clad layer 8 was vertically etched by RIBE (reactive ion beam etching).

Figure 6E:
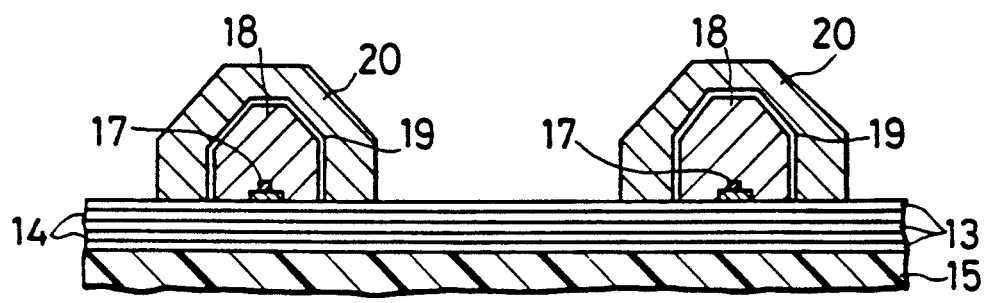

(5) As shown in FIG. 6E, a p-GaAs activation layer 19 was formed by $AsH_3$, TMG and dopant DEZn (dopant diethyl Znic), and a p-A(GaAs clad layer 20 was grown by $AsH_3$, TMG, TMAl and dopant $SiH_4$.

Figure 6F:
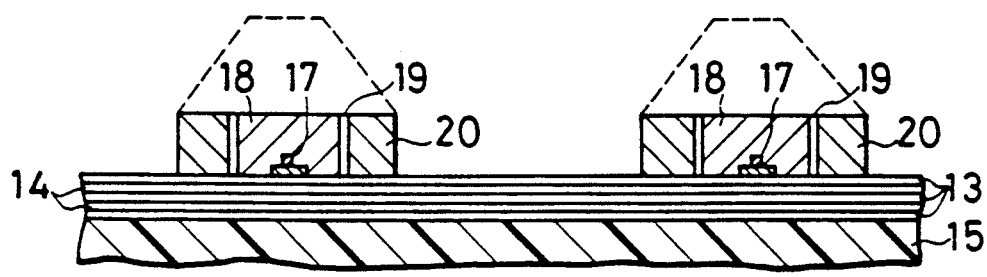
Figure 6G:
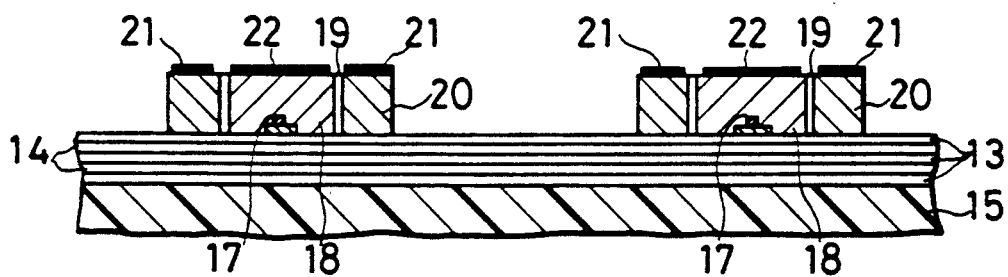
Figure 6H:
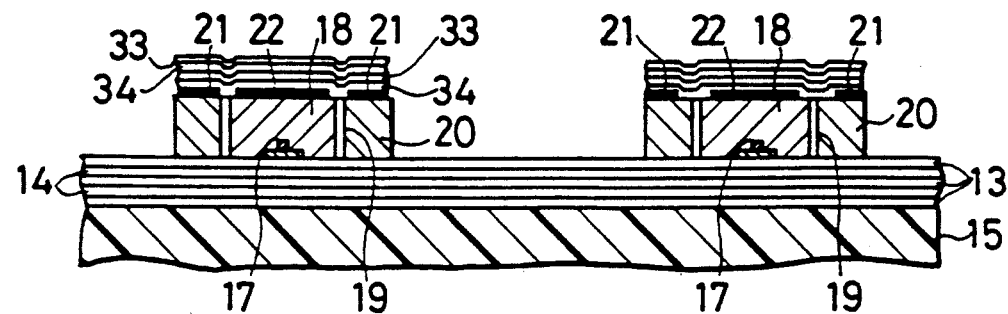

(6) As shown in FIG. 6F, the top surfaces of the respective. layers were etched flatly by RIBE. Then, an Au/Zn electrode 21 and an Au/Ge electrode 22 were formed thereon as shown in FIG. 6G. Then, as shown in FIG. 6H, high refractive index amorphous films 34 and low refractive index amorphous films 33 were alternately laminated on the growth surface to form a mirror.

Another embodiment of the manufacturing process of the light emitting device of the present invention is now explained with reference to FIGS. 7A-7H.

Figure 7A:
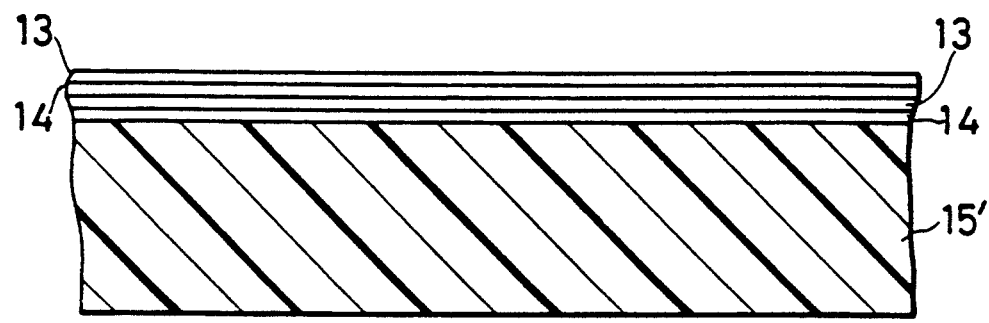
FIGS. 7A–7H show sectional view for illustrating another embodiment of the method for manufacturing the light emitting device in accordance with the present invention.

(1') As shown in FIG. 7A, $SiO_2$ films 13 and $TiO_2$ films 14 were alternately formed on a ceramic substrate 15' by the electron beam evaporation. The thicknesses of the $SiO_2$ film 13 and the $TiO_2$ film 14 were 1500Å and 900Å, respectively.

Figure 7B:
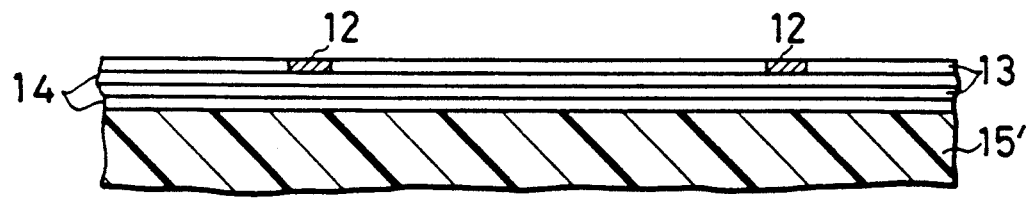

(2') As shown in FIG. 7B, As ions were implanted into a fine area 12 (approximately 2 $\mu$m in diameter) to enhance the nucleus formation density at that area.

Figure 7C:

(3') As shown in FIG. 7C, a p-GaAlAs clad layer 20' was formed by the MOCVD method and the source materials TBAs, TMG, TMA( and dopant DEZn.

Figure 7D:
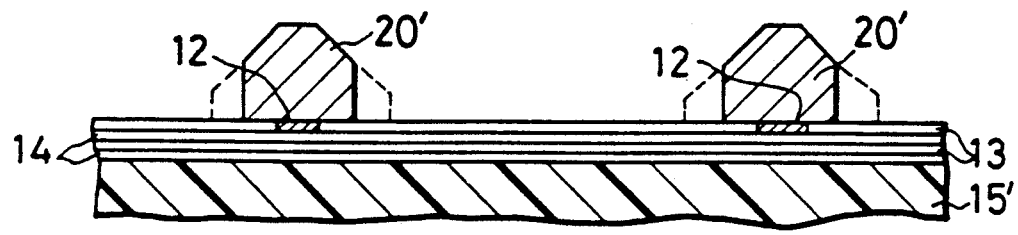

(4') As shown in FIG. 7D, the grown end plane of the layer 20' was etched off by RIBE to form a vertical plane.

Figure 7E:
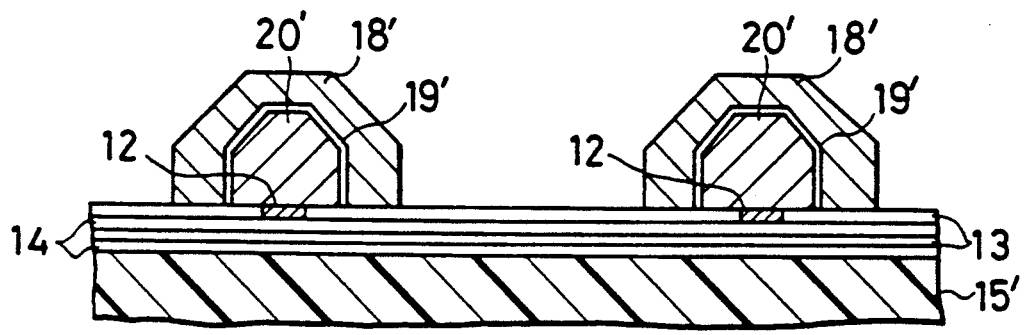

(5') As shown in FIG. 7E, a P-GaAs activation layer 19' was formed by TBAs, TMG and dopant DEZn at the pressure of 100 Torr, and an n-GaAlAs clad layer 18' was formed by TBAs, TMG, TMAl and dopant $SiH_4$ to form a double hetero-structure.

Figure 7F:
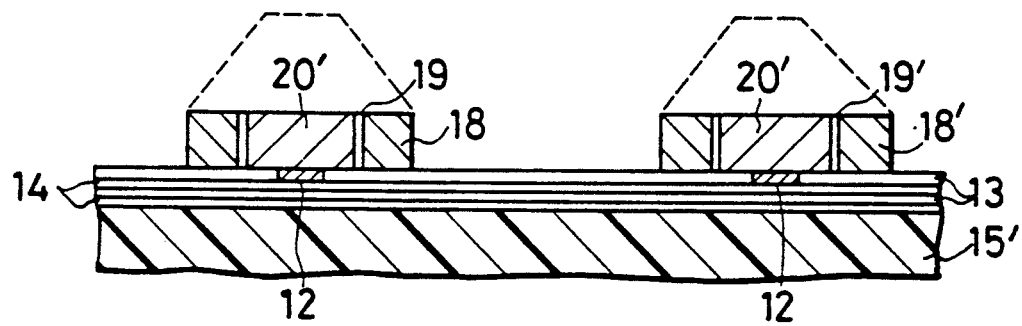
Figure 7G:
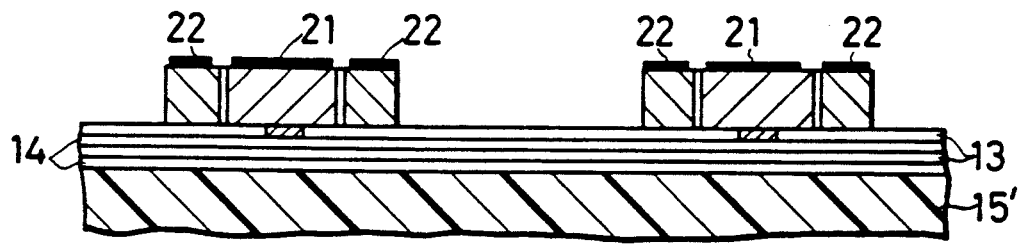
Figure 7H:
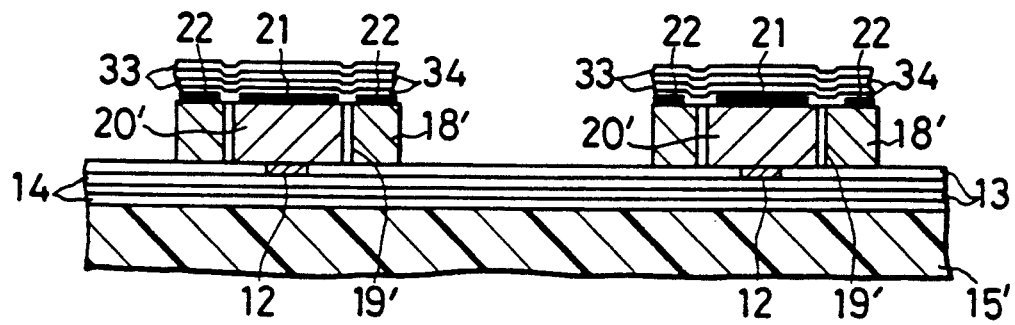

(6') As shown in FIG. 7F, the top surfaces of the respective layers were etched flatly by RIBE. As shown in FIG. 7G, an Au/Zn electrode (p-side electrode) 21 and an Au/Ge electrode (n-side electrode) 22 were formed thereon. The electrodes were formed by a resistive heating evaporation method. As shown in FIG. 7H, high refractive index amorphous films 34 and low refractive index amorphous films 33 were alternately laminated thereon by the electron beam evaporation to form a reflection mirror. The materials of the films 34 and 33 were $TiO_2$ and $SiO_2$, respectively.

The present invention may be applied in various ways other than those described in the embodiments. The present invention includes all such applications without departing from the scope of the claims.

I claim:

1. A light emitting device comprising:
   a substrate;
   a reflective mirror formed on said substrate by alternately laminating a plurality of high refractive index layers and low refractive index layers, each high refractive index layer comprising an amorphous or polycrystalline dielectric, and each low refractive index layer comprising amorphous or polycrystalline $SiO_2$, arranged such that a top layer that is, furthest from said substrate is a low refractive index layer;
   a nucleus formation surface, provided on a top surface of said top layer having a low refractive index, formed from amorphous or polycrystalline material having a higher nucleus formation density than that of the remaining parts of said top surface of said top layer and having a sufficiently small area to allow the growth of a crystal thereon from only a single nucleus; and
   a semiconductor layer, formed from a single crystal grown on said top surface of said top layer having a low refractive index on which said nucleus formation surface is provided, having a light emitting area.

2. A light emitting device according to claim 1, wherein said nucleus formation surface comprises a small piece of a high nucleus formation density material loaded on said surface layer.

3. A light emitting device according to claim 1, wherein said nucleus formation surface comprises a fine area formed by implanting ions to said surface layer.

4. A light emitting device according to claim 1, wherein said light emitting area comprises an activation layer, a p-type clad layer and an n-type clad layer formed on opposite sides of said activation layer and a pair of electrodes connected to said clad layers to supply a current to said activation layer.

5. A light emitting device according to claim 4, wherein said activation layer and said clad layers are made of GaAs and AlGaAs, respectively.

6. A light emitting device according to claim 1, further comprising a second reflection mirror formed on said light emitting area.

7. A light emitting device according to claim 6, wherein said second reflection mirror is a multi-layer film having dielectric material layers of different refractive indices alternately laminated.

8. A light emitting device according to claim 1, wherein the high refractive index layers of said reflection mirror are made of dielectric material selected from $TiO_2$ and $Al_2O_3$.

9. A light emitting device according to claim 1, wherein said substrate is made of quartz or ceramics.

* * * * *

UNITED STATES PATENT AND TRADEMARK OFFICE
CERTIFICATE OF CORRECTION

PATENT NO. : 5,239,190
DATED : August 24, 1993
INVENTOR(S) : HIDESHI KAWASAKI

Page 1 of 2

It is certified that error appears in the above-identified patent and that said Letters Patent is hereby corrected as shown below:

COLUMN 1

Line 59, "an" should read --as--.
Line 60, "method" should read --methods--.

COLUMN 2

Line 17, "areas" should read --area--.
Line 46, "view" should read --views--.
Line 63, "of those dielec-" should be deleted.
Line 64, "tric material layers 5 and 6 are those" should be deleted.

COLUMN 3

Line 30, "is" should read --in--.

COLUMN 4

Line 30, "respective." should read --respective--.

UNITED STATES PATENT AND TRADEMARK OFFICE
CERTIFICATE OF CORRECTION

PATENT NO.   : 5,239,190
DATED        : August 24, 1993
INVENTOR(S)  : HIDESHI KAWASAKI It is certified that error appears in the above-identified patent and that said Letters Patent is hereby corrected as shown below:

COLUMN 5

Line 18, "is," should read --is--.

Signed and Sealed this

Fifth Day of April, 1994

Attest:

BRUCE LEHMAN

Attesting Officer

Commissioner of Patents and Trademarks